United States Patent
Wu

(10) Patent No.: US 7,199,445 B2
(45) Date of Patent: Apr. 3, 2007

(54) INTEGRATED CAPACITOR ON PACKAGING SUBSTRATE

(75) Inventor: Sung-Mao Wu, Kaohsiung County (TW)

(73) Assignee: Advanced Semiconductor Engineering Inc., Kaohsiung (TW)

( * ) Notice: Subject to any disclaimer, the term of this patent is extended or adjusted under 35 U.S.C. 154(b) by 0 days.

(21) Appl. No.: 11/183,864

(22) Filed: Jul. 19, 2005

(65) Prior Publication Data
US 2006/0081960 A1    Apr. 20, 2006

(30) Foreign Application Priority Data
Oct. 20, 2004   (TW) ............................... 93131798 A

(51) Int. Cl.
*H01L 29/00*   (2006.01)
(52) U.S. Cl. .................... 257/534; 257/299; 257/309; 257/532; 257/E21.018; 257/E21.011
(58) Field of Classification Search ............... None
See application file for complete search history.

(56) References Cited

U.S. PATENT DOCUMENTS

| | | | | |
|---|---|---|---|---|
| 5,350,707 A | * | 9/1994 | Ko et al. ..................... 438/396 |
| 6,033,953 A | * | 3/2000 | Aoki et al. .................. 438/255 |
| 6,115,233 A | * | 9/2000 | Seliskar et al. ............. 361/303 |
| 6,504,236 B2 | * | 1/2003 | Bissey ........................ 257/666 |

\* cited by examiner

*Primary Examiner*—Evan Pert
*Assistant Examiner*—Benjamin P. Sandvik
(74) *Attorney, Agent, or Firm*—Birch, Stewart, Kolasch & Birch, LLP

(57) ABSTRACT

An integrated capacitor on a packaging substrate. The integrated capacitor comprises a conductor plane, a first dielectric layer and a signal transmission layer. The conductor plane has an extrusion layer of a first thickness. The first extrusion layer and the conductor plane are made of the same material. The first dielectric layer is formed on the conductor plane. The signal transmission layer is formed on the first dielectric layer.

15 Claims, 1 Drawing Sheet

INTEGRATED CAPACITOR ON PACKAGING SUBSTRATE

BACKGROUND

The invention relates to semiconductor packaging and, in particular, to an integrated capacitor on a packaging substrate.

Since the operating speed of packaged circuits is concerned with the evaluation of power planes, the voltage stability of power planes is critical during operation of high frequency/high speed circuits. When many output drivers switch simultaneously, large currents crowd, into a ground end or power supply end, thus generating simultaneous voltage change in the power distribution of a chip or packaged sample. This simultaneous switch causes a simultaneous voltage difference between the ground potentials of an internal chip ground and a system ground. The offset of the ground potential is a simultaneous switching noise, which is expressed as V=L(di/dt). The voltage change of the simultaneous switching noise is proportional to inductances coupled to power and a rate of current change. Since semiconductor circuits have become more integrated, larger inductance is induced on longer routings. The simultaneous switching noise also becomes more prominent.

To overcome the simultaneous switching noise issue, decoupling capacitors are traditionally disposed at specific locations on power planes in packaging substrate design. The decoupling capacitors are typically chip-type capacitors such that an impact on power planes can be minimized during operation of high frequency/high speed circuits.

However, additional discrete chip-type capacitors increase packaging cost and failure probability, resulting in diminished reliability.

SUMMARY

An embodiment of an integrated capacitor on a packaging substrate utilizes a discontinuous waveguide or transmission line structure to induce an equivalent capacitor in a high frequency/high speed circuit.

An embodiment of an integrated capacitor on a packaging substrate comprises a conductor plane, a dielectric layer and a signal transmission layer. The conductor plane has an extrusion layer of a first thickness. The first dielectric layer is formed on the conductor plane. The signal transmission layer is formed on the first dielectric layer.

An embodiment fo an integrated capacitor on a packaging substrate has three characteristics. First, use of chip-type passive elements can be minimized. Cost can be reduced and routing flexibility can be increased. Second, the integrated capacitor can reduce packaging area. The number and locations of the integrated capacitors are not concerned with a packaging structure. Third, multiple capacitors, with a multi-layer structure, can be formed in parallel to enhance a total capacitance thereof.

Further scope of the applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given hereinbelow and the accompanying drawings which are given by way of illustration only, and thus are not limitative of the present invention, and wherein.

DETAILED DESCRIPTION

Figure 1:
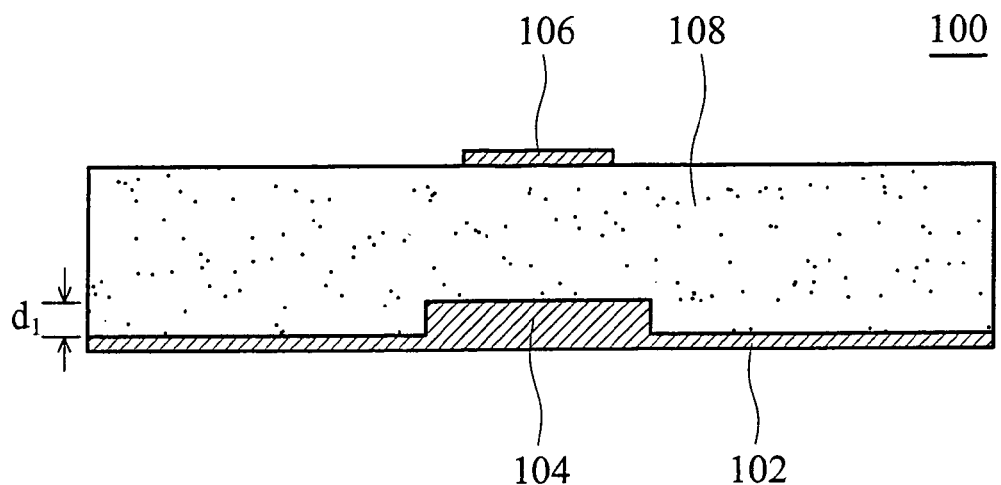
FIG. 1 shows an integrated capacitor on a packaging substrate according to an embodiment of the invention.

FIG. 1 shows an integrated capacitor on a packaging substrate according to an embodiment of the invention. The integrated capacitor 100 comprises a conductor plane 102, a dielectric layer 108 and a signal transmission layer 106. The conductor plane 102 is a ground plane or a power plane. The conductor plane 102 has an extrusion layer 104 of a first thickness $d_1$. The first dielectric layer 108 is formed on the conductor plane 102. The extrusion layer 104 is formed on the conductor plane and extruded into the dielectric layer 108. A dielectric constant of the dielectric layer 108 determines a capacitance of the integrated capacitor. The equivalent capacitance is larger when the dielectric constant of the dielectric layer 108 is higher. The signal transmission layer 106 can be a plane and a waveguide is thus formed. Alternatively, the signal transmission layer 106 can be a strip, thus forming a microstrip structure.

The signal transmission layer 106 is formed on the first dielectric layer 108 but does not contact the extrusion layer 104. The extrusion layer 104 and the conductor plane 102 are made of the same material and integrally formed. The conductor plane 102 and the signal transmission layer 106 are typically formed with the same metal. Preferably, the metal is copper.

The conductor plane 102 and the signal transmission layer 106 collectively form a waveguide or a microstrip structure. The extrusion layer 104 can be formed at a specific location on the conductor plane 102 by etching or electroplating. Thus, a discontinuity is formed in a waveguide or transmission line structure, inducing an equivalent capacitor. The equivalent capacitor is used as a decoupling capacitor to suppress simultaneous switching noise (SSN).

Figure 2:
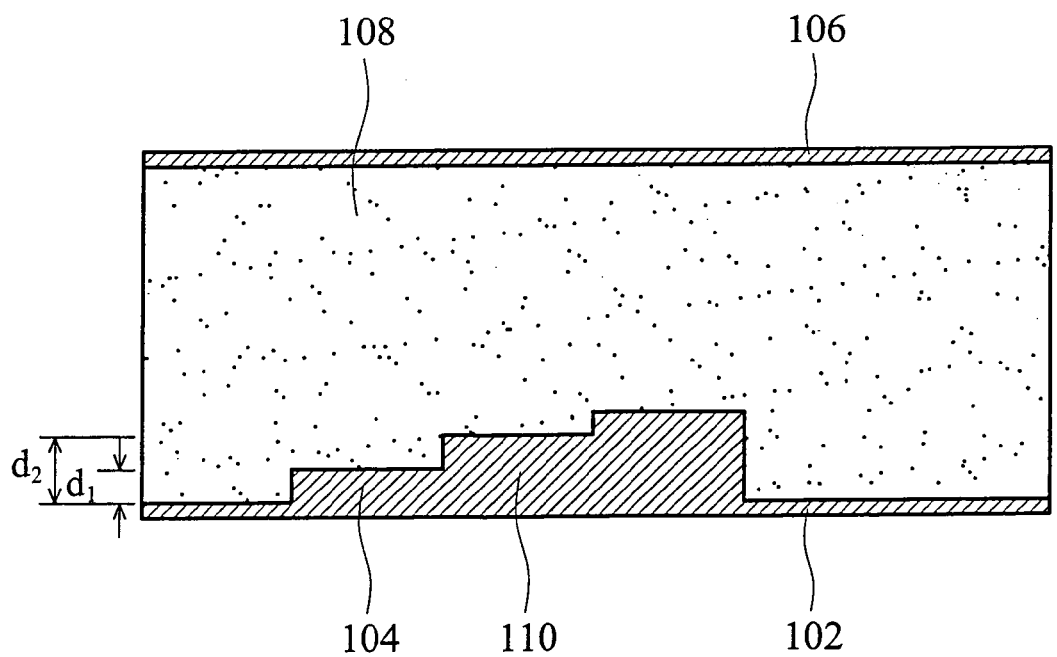
FIG. 2 shows an integrated capacitor on a packaging substrate according to another embodiment of the invention.

FIG. 2 shows an integrated capacitor on a packaging substrate according to another embodiment of the invention. The integrated capacitor 300 further comprises a second extrusion layer 110 of a second thickness $d_2$. The second extrusion layer 110 is formed on the conductor plane 102 and extruded into the dielectric layer 108. The second thickness $d_2$ is not equal to the first thickness $d_1$. The second extrusion layer 110, the first extrusion layer 104 and the conductor plane 102 are made of the same material and integrally formed. The second extrusion layer 110 and the first extrusion layer 104 can be formed at a specific location on the conductor plane 102 by etching or electroplating. Although only the first and second extrusion layers are mentioned, the scope of the invention is not limited thereto, and more extrusion layers can be added.

In the structure shown in FIG. 2, the first and the second extrusion layers 104, 110 are connected in parallel. The first extrusion layer 104 induces a first equivalent capacitance $C_1$. The second extrusion layer 110 induces a second equivalent capacitance $C_2$. Since the first and the second extrusion layers 104, 110 are formed in parallel, the total capacitance is equal to a sum of the first equivalent capacitance $C_1$ and the second equivalent capacitance $C_2$. When multiple extrusion layers are present, the total capacitance is equal to the sum of the multiple equivalent capacitances.

Integrated capacitors on packaging substrates have at least three potential advantages. First, use of chip-type passive elements can be minimized. Cost can be reduced and routing flexibility can be increased. Second, the integrated capacitor can reduce packaging area. The number and locations of the integrated capacitors are not concerned with a packaging structure. Third, multiple capacitors, with a multi-layer structure, can be formed in parallel to enhance a total capacitance thereof.

While the invention has been described by way of example and in terms of preferred embodiment, it is to be understood that the invention is not limited thereto. To the contrary, it is intended to cover various modifications and (as would be apparent to those skilled in the art). Therefore, the scope of the appended claims should be accorded the broadest interpretation so as to encompass all such modifications.

What is claimed is:

1. An integrated capacitor on a packaging substrate, the integrated capacitor comprising:
    a conductor plane with a first extrusion layer of a first thickness and a second extrusion layer of a second thickness, wherein the first extrusion layer, the second extrusion layer and the conductor plane are made with the same material and fanned as a whole, wherein the second thickness is not equal to the first thickness of the first extrusion layer, and wherein the conductor plane is a ground plane;
    a dielectric layer formed on the conductor plane; and
    a signal transmission layer formed on the dielectric layer.

2. The integrated capacitor as claimed in claim 1, wherein the conductor plane is a power plane.

3. The integrated capacitor as claimed in claim 1, wherein the signal transmission layer is a plane.

4. The integrated capacitor as claimed in claim 1, wherein the signal transmission layer is a strip.

5. The integrated capacitor as claimed in claim 1, wherein the conductor plane and the signal transmission layer are metal layers.

6. The integrated capacitor as claimed in claim 5, wherein the metal layers are copper layers.

7. The integrated capacitor as claimed in claim 1, wherein the first and the second extrusion layers are connected in parallel.

8. An integrated capacitor on a packaging substrate, the integrated capacitor comprising:
    a conductor plane with a first extrusion layer of a flint thickness and a second extrusion layer of a second thickness, wherein the first extrusion layer, the second extrusion layer and the conductor plane are made with the same material and formed as a whole, and the second thickness is not equal to the first thickness of the first extrusion layer;
    a dielectric layer fanned on the conductor plane; and
    a signal transmission layer formed on the dielectric layer.

9. The integrated capacitor as claimed in claim 8, wherein the conductor plane is a ground plane.

10. The integrated capacitor as claimed in claim 8, wherein the conductor plane is a power plane.

11. The integrated capacitor as claimed in claim 8, wherein the signal transmission layer is a plane.

12. The integrated capacitor as claimed in claim 8, wherein the signal transmission layer is a strip.

13. The integrated capacitor as claimed in claim 8, wherein the conductor plane and the signal transmission layer we metal layers.

14. The integrated capacitor as claimed in claim 13, wherein the metal layers are copper layers.

15. The integrated capacitor as claimed in claim 8, wherein the first and the second extrusion layers are connected in parallel.

* * * * *